(12) United States Patent
Sugito et al.

(10) Patent No.: US 10,969,410 B2
(45) Date of Patent: Apr. 6, 2021

(54) CURRENT SENSOR DEVICE

(71) Applicant: DENSO CORPORATION, Kariya (JP)

(72) Inventors: Tatsuaki Sugito, Kariya (JP); Kohsuke Nomura, Kariya (JP); Ryosuke Sakai, Kariya (JP); Takuma Esaka, Kariya (JP)

(73) Assignee: DENSO CORPORATION, Kariya (JP)

( * ) Notice: Subject to any disclaimer, the term of this patent is extended or adjusted under 35 U.S.C. 154(b) by 61 days.

(21) Appl. No.: 16/272,196

(22) Filed: Feb. 11, 2019

(65) Prior Publication Data

US 2019/0170795 A1 Jun. 6, 2019

Related U.S. Application Data

(63) Continuation of application No. PCT/JP2017/033621, filed on Sep. 18, 2017.

(30) Foreign Application Priority Data

Nov. 17, 2016 (JP) .............................. JP2016-224251

(51) Int. Cl.
*G01R 15/20* (2006.01)
*G01R 33/00* (2006.01)
*G01R 33/09* (2006.01)
*H02B 1/20* (2006.01)

(52) U.S. Cl.
CPC ........... *G01R 15/207* (2013.01); *G01R 15/20* (2013.01); *G01R 33/0005* (2013.01); *G01R 33/0047* (2013.01); *G01R 33/091* (2013.01); *H02B 1/20* (2013.01)

(58) Field of Classification Search
CPC ...... G01R 15/20; G01R 15/202; G01R 15/05; G01R 15/207; G01R 33/0005; G01R 33/0047; G01R 33/072; G01R 33/091; G01R 33/0011; G01R 33/06; G01R 33/07; G01R 33/075; G01R 33/09; G01R 33/093;
(Continued)

(56) References Cited

U.S. PATENT DOCUMENTS

2013/0214593 A1 8/2013 Ohashi et al.
2014/0111196 A1* 4/2014 Sakai ................. G01R 19/0092
324/252
(Continued)

FOREIGN PATENT DOCUMENTS

JP 2010014477 A * 1/2010
JP 2010-078586 A 4/2010
(Continued)

*Primary Examiner* — David M Schindler
(74) *Attorney, Agent, or Firm* — Posz Law Group, PLC

(57) ABSTRACT

A current sensor device includes: at least one bus bar; at least one sensor package that includes a magneto-electric conversion element which detects a current flowing through the bus bar and an external connection terminal which is electrically connected to the magneto-electric conversion element; a printed circuit board that is disposed on the sensor package opposite to the bus bar, and electrically connected to the terminal; a magnetic shield body that shields the magneto-electric conversion element from an external magnetic field; and a resin element that integrally holds at least a part of the magnetic shield body and the bus bar fixed to the sensor package.

8 Claims, 6 Drawing Sheets

(58) Field of Classification Search
CPC .. G01R 33/095; G01R 33/096; G01R 33/098; H02B 1/20
See application file for complete search history.

(56) References Cited

U.S. PATENT DOCUMENTS

| | | | | |
|---|---|---|---|---|
| 2014/0333293 | A1* | 11/2014 | Sakai | G01R 15/183 |
| | | | | 324/127 |
| 2016/0258985 | A1* | 9/2016 | Nomura | G01R 15/207 |
| 2017/0343584 | A1* | 11/2017 | Abe | G01R 15/148 |
| 2017/0370968 | A1* | 12/2017 | Okumura | G01R 15/16 |

FOREIGN PATENT DOCUMENTS

| | | |
|---|---|---|
| JP | 5590699 B2 | 9/2014 |
| JP | 2014-202480 A | 10/2014 |
| JP | 2015-083941 A | 4/2015 |
| JP | 2015-210158 A | 11/2015 |

* cited by examiner

CURRENT SENSOR DEVICE

CROSS REFERENCE TO RELATED APPLICATION

The present application is a continuation application of International Patent Application No. PCT/JP2017/033621 filed on Sep. 18, 2017, which designated the U.S. and claims the benefit of priority from Japanese Patent Application No. 2016-224251 filed on Nov. 17, 2016. The entire disclosures of all of the above applications are incorporated herein by reference.

TECHNICAL FIELD

The present disclosure relates to a current sensor device.

BACKGROUND

A current sensor device (current detection device) is a careless type current sensor device including a bus bar, a magneto-electric conversion element (magnetic detection element), a printed circuit board, a housing, and a magnetic shield body. The magneto-electric conversion element is mounted on the printed circuit board, and the printed circuit board is fixed to the housing. The bus bar and the magnetic shield body are held by a resin housing.

SUMMARY

According to one example embodiment, a current sensor device includes: at least one bus bar; at least one sensor package that includes a magneto-electric conversion element which detects a current flowing through the bus bar and an external connection terminal which is electrically connected to the magneto-electric conversion element; a printed circuit board that is disposed on the sensor package opposite to the bus bar, and electrically connected to the terminal; a magnetic shield body that shields the magneto-electric conversion element from an external magnetic field; and a resin element that integrally holds at least a part of the magnetic shield body and the bus bar fixed to the sensor package.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
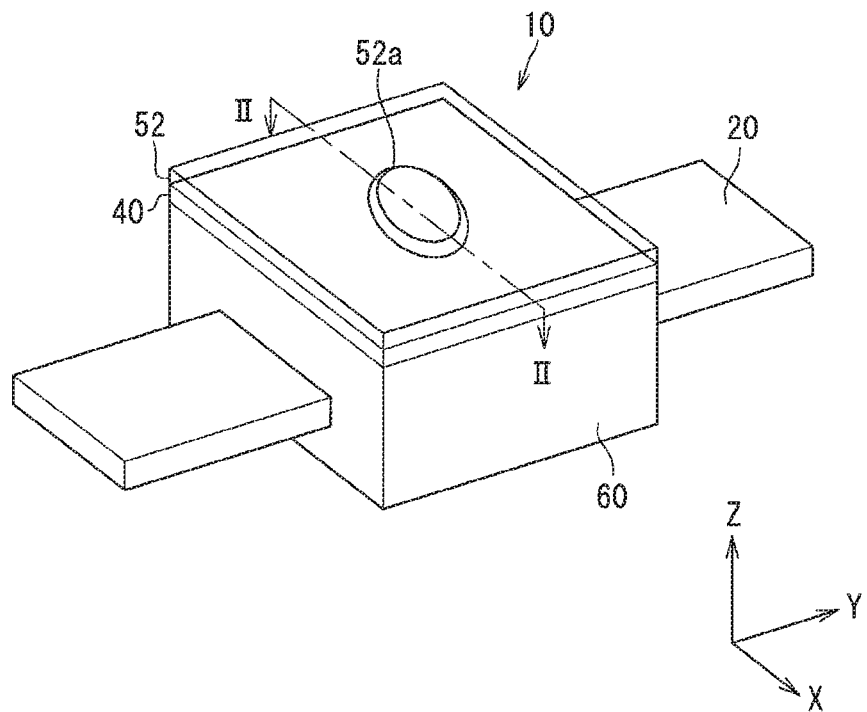
FIG. 1 is a perspective view showing a schematic configuration of a current sensor device according to a first embodiment.

In a cureless type current sensor device, a relative position between a magneto-electric conversion element and a bus bar in a plate thickness direction of the bus bar and a relative position between the magneto-electric conversion element and the bus bar in a width direction of the bus bar are important. If a relative position between the magneto-electric conversion element and the bus bar deviates from an initially adjusted position, a current detection accuracy decreases.

In the current sensor device, the printed circuit board and the housing are interposed between the magneto-electric conversion element and the bus bar. Therefore, when a temperature changes in a usage environment, a relative position is shifted due to a difference in linear expansion coefficient. In addition, even when the vibration is applied in the usage environment, the relative position is deviated. As described above, the relative position between the magneto-electric conversion element and the bus bar is more likely to be deviated in the usage environment. Therefore, there arises a problem that the current detection accuracy is lowered.

In the present disclosure, a current sensor device is provided to prevent a relative position between a magneto-electric conversion element and a bus bar from being deviated.

According to an aspect of the present disclosure, a current sensor device includes: at least one bus bar that has a front surface and a back surface opposite to the front surface in a thickness direction of the bus bar; at least one sensor package that includes a magneto-electric conversion element which detects a current flowing through the bus bar and an external connection terminal which is electrically connected to the magneto-electric conversion element, the at least one sensor package being fixed to the front surface of the bus bar; a printed circuit board that is disposed on the sensor package opposite to the bus bar, and electrically connected to the terminal; a magnetic shield body that shields the magneto-electric conversion element from an external magnetic field; and a resin element that integrally holds at least a part of the magnetic shield body and the bus bar fixed to the sensor package.

According to the above current sensor device, the sensor package having the magneto-electric conversion element is fixed to the front surface of the bus bar without interposing the printed circuit board. In other words, the sensor package is directly fixed to the bus bar. Therefore, the relative position between the magneto-electric conversion element and the bus bar can be prevented from being deviated due to a temperature change or vibration in the usage environment.

Embodiments will be described with reference to the drawings. In the multiple embodiments, functionally and/or structurally corresponding parts are given the same reference numerals. Hereinafter, a plate thickness direction of a bus bar is defined as a Z-direction. A width direction of the bus bar orthogonal to the Z-direction is defined as an X-direction. A direction orthogonal to both of the Z-direction and the X-direction, which is an extension direction of the bus bar is defined as a y-direction. Unless otherwise specified, a shape along an XY-plane is a planar shape.

First Embodiment

First, a current sensor device will be described with reference to FIGS. 1 to 3. In FIG. 2, a sensor package is illustrated in a simplified manner.

Figure 2:
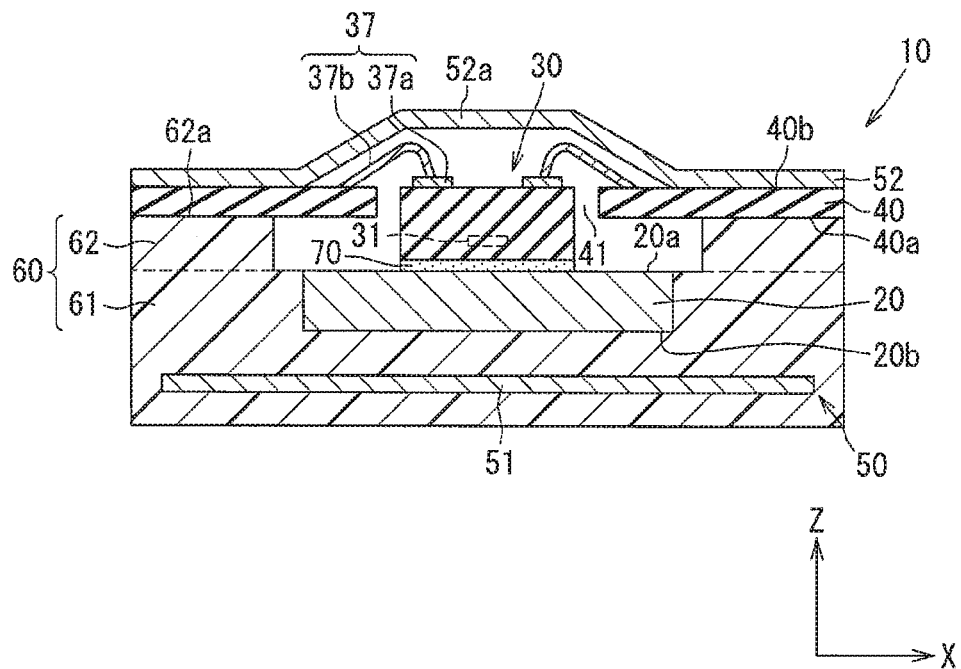
FIG. 2 is a cross-sectional view taken along a line II-II of FIG. 1.
Figure 3:
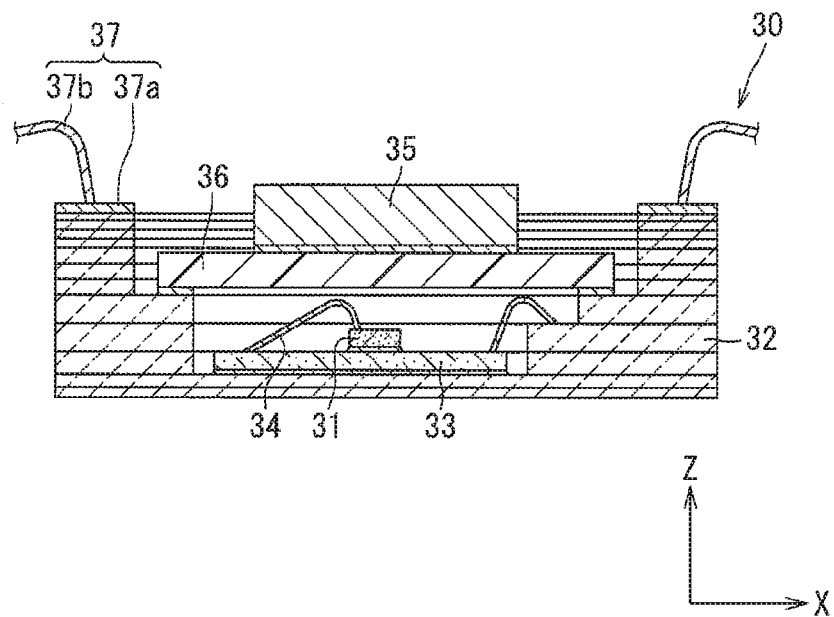
FIG. 3 is a cross-sectional view showing a schematic configuration of a sensor package.

As shown in FIGS. 1 and 2, a current sensor device 10 includes a bus bar 20, a sensor package 30, a printed circuit board 40, a magnetic shield body 50, and a resin portion 60. The current sensor device 10 is a current sensor with a bus bar 20 forming a current path. The current sensor device 10 is a bus bar unit having a current sensor. The current sensor device 10 is mounted on a vehicle, for example.

The bus bar 20 is formed of a conductive member so as to function as a current path. The bus bar 20 has one surface 20a and a back surface 20b which is a surface opposite to the one surface 20a in the Z-direction which is the plate thickness direction. In the present embodiment, the bus bar 20 is formed by punching a metal plate made of copper into a substantially rectangular shape in a plan view. The plate thickness of the bus bar 20 is substantially even in total length. The bus bar 20 extends in the y-direction, and the X-direction is the width direction. An intermediate portion of the bus bar 20 in the y-direction is held by the resin portion 60, and both end portions of the bus bar 20 protrude from the resin portion 60.

The sensor package 30 is disposed on the one surface 20a of the bus bar 20 and is fixed to the one surface 20a. The sensor package 30 is directly fixed to the one surface 20a without interposing the printed circuit board 40. In the present embodiment, the sensor package 30 is fixed to the one surface 20a by the adhesive 70. As the adhesive 70, a moisture curing type adhesive, adhesive sheet, or the like can be employed.

As the sensor package 30, a ceramic package, a mold package, or the like can be employed. As shown in FIG. 3, the sensor package 30 according to the present embodiment includes a sensor chip 31, a ceramic package 32, a processing circuit chip 33, a bonding wire 34, a bias magnet 35, a spacer 36, and a terminal portion 37. The sensor package 30 and the magnetic shield body 50 configure the current sensor. The current sensor is a coreless type current sensor that does not require a core.

A magneto-electric conversion element (not shown) is formed on the sensor chip 31. For that reason, the sensor chip 31 corresponds to the magneto-electric conversion element. The magneto-electric conversion element detects a magnetic flux density of a magnetic field generated when a current flows through the corresponding bus bar 20, and converts the magnetic flux density into an electric signal. As the magneto-electric conversion element, a giant magneto-resistance effect element (GMR), an anisotropic magneto-resistance effect element (AMR), a tunneling magneto-resistance effect element (TMR), a Hall element, or the like can be employed. In the present embodiment, the magneto-electric conversion element whose electric signal changes depending on a direction of a magnetic vector such as GMR or TMR is formed on the sensor chip 31.

The ceramic package 32 is a container that provides a space for accommodating the sensor chip 31. The ceramic package 32 is formed by stacking multiple ceramic plates made of alumina or the like. The ceramic package 32 has a side wall portion provided in an annular shape and a bottom portion for closing one of the openings of the side wall portion. A wiring (not shown) is formed on the ceramic package 32. The ceramic package 32 is fixed to the bus bar 20 through an adhesive 70 on an outer surface of the bottom portion opposite to an inner surface of the bottom portion.

The processing circuit chip 33 performs predetermined calculation processing with the use of a signal input from the sensor chip 31, and outputs a calculation result to the printed circuit board 40. The processing circuit chip 33 is also disposed in an accommodation space of the ceramic package 32. The sensor chip 31 is mounted on the processing circuit chip 33 through an adhesive or the like. The processing circuit chip 33 is fixed to the inner surface of the bottom portion of the ceramic package 32. The sensor chip 31 is fixed to the inner surface of the bottom portion through the processing circuit chip 33. In the present embodiment, the sensor chip 31 and the processing circuit chip 33 are chips (for example, silicon chips) made of the same semiconductor material.

The sensor chip 31 is electrically connected to the processing circuit chip 33 through bonding wires 34. The processing circuit chip 33 is electrically connected to the wiring of the ceramic package 32 through the bonding wire 34.

The bias magnet 35 applies a magnetic vector as a reference of an electric signal to the sensor chip 31. The bias magnet 35 may be a permanent magnet or an electromagnet. The bias magnet 35 is disposed on a side of the sensor chip 31 opposite to the bus bar 20 so as to overlap with the sensor chip 31 in a plan view from the Z-direction. In other words, the sensor chip 31 is disposed between the bias magnet 35 and the bus bar 20 in the Z-direction. In the present embodiment, a part of the bias magnet 35 is disposed in the accommodation space of the ceramic package 32, and the remaining part protrudes from the accommodation space to the outside.

The bias magnet 35 is fixed to the spacer 36 through an adhesive or the like. The spacer 36 is disposed between the sensor chip 31 and the bias magnet 35 in the Z-direction. The spacer 36 is a member for securing a predetermined distance between the sensor chip 31 and the bias magnet 35. The spacer 36 is made of, for example, a resin material. The ceramic package 32 has a step provided between the inner surface of the bottom portion and the upper opening end in the Z-direction on the accommodation space side. The step is annular. The spacer 36 is fixed to the step of the ceramic package 32 through an adhesive or the like.

The terminal portion 37 is a portion for electrically connecting to the printed circuit board 40 in the sensor package 30. The terminal portion 37 is electrically connected to the sensor chip 31. In the present embodiment, the terminal portion 37 is electrically connected to the sensor chip 31 through the wiring of the ceramic package 32, the processing circuit chip 33, and the bonding wire 34. The terminal portion 37 includes a pad 37a formed at an upper open end of the ceramic package 32 and a bonding wire 37b. The pad 37a is an electrode portion of a wiring formed on the ceramic package 32. One end of the bonding wire 37b is connected to the pad 37a, and the other end is connected to a land (not shown) of the printed circuit board 40.

The sensor package 30 configured as described above is disposed on the one surface 20a of the bus bar 20 such that the terminal portion 37 is located at a position farther from the one surface 20a than the sensor chip 31. More specifically, the outer surface of the bottom portion of the ceramic package 32 is disposed so as to face the one surface 20a.

In the printed circuit board 40, a wiring is disposed on an electrically insulating base material containing resin. The printed circuit board 40 is electrically connected to the terminal portion 37 of the sensor package 30. The printed circuit board 40 is electrically connected to the sensor chip 31 (magneto-electric conversion element) through the terminal portion 37. The printed circuit board 40 is disposed on a side of the sensor package 30 opposite to the bus bar 20. The printed circuit board 40 has an opposing surface 40a facing the bus bar 20 in the Z-direction, and a back surface 40b which is a surface opposite to the opposing surface 40a. The opposing surface 40a corresponds to a first surface, and the back surface 40b corresponds to a second surface. Electronic components may be mounted on the printed circuit board 40 to form a circuit together with the wiring.

The printed circuit board 40 is formed with a through hole 41 penetrating in the Z-direction, that is, penetrating across the opposing surface 40a and the back surface 40b. The through hole 41 is provided corresponding to the ceramic package 32 of the sensor package 30 in a plan view from the Z-direction. A part of the sensor package 30 is disposed in the through hole 41. At least a part of the terminal portion 37 is disposed on the back surface 40b side of the printed circuit board 40. In the present embodiment, all of the pads 37a and the bonding wire 37b are disposed on the back surface 40b side. One end of the bonding wire 37b is connected to a land (not shown) formed on the back surface 40b.

The magnetic shield body 50 is made of a magnetic material. The magnetic shield body 50 prevents transmission of an external magnetic field to the current sensor device 10 through the sensor chip 31 (magneto-electric conversion element). In other words, the magnetic shield body 50 shields the sensor chip 31 from the external magnetic field.

According to the present embodiment, the magnetic shield body 50 includes a first magnetic shield body 51 and a second magnetic shield body 52. Each of the first magnetic shield body 51 and the second magnetic shield body 52 is disposed so as to overlap with the sensor chip 31 in a plan view from the Z-direction. The first magnetic shield body 51 and the second magnetic shield body 52 are disposed opposite to each other, and the sensor chip 31 is disposed in an opposite region of the first magnetic shield body 51 and the second magnetic shield body 52. The first magnetic shield body 51 has a plate-like shape and is held by the resin portion 60. The second magnetic shield body 52 is fixed to the back surface 40b of the printed circuit board 40 by bonding, fastening, or the like. The second magnetic shield body 52 has a recess portion 52a. The recess portion 52a is provided so as to accommodate a portion disposed on the back surface 40b side of the terminal portion 37.

The resin portion 60 integrally holds at least a part of the magnetic shield body 50 and the bus bar 20. In the present embodiment, the resin portion 60 is a resin molded article in which the bus bar 20 and the first magnetic shield body 51 are molded as insert parts.

The resin portion 60 has a base portion 61 and protrusion portions 62. A dashed line in FIG. 2 indicates a boundary between the base portion 61 and the protrusion portions 62. The bus bar 20 is held by the base portion 61. The first magnetic shield body 51 is also held by the base portion 61. The first magnetic shield body 51 is entirely embedded in the base portion 61. The bus bar 20 is held by the base portion 61 so that the one surface 20a is exposed flush with an end surface of the base portion 61 on the side of the protrusion portions 62.

The protrusion portions 62 are continuous with the base portion 61, and the protrusion portions 62 protrude from the base portion 61 in the Z-direction toward the printed circuit board 40. A tip end face 62a of each of the protrusion portions 62 is in contact with the opposing surface 40a of the printed circuit board 40. The printed circuit board 40 is supported at a position separated from the bus bar 20 in the Z-direction by the terminal portion 37 and the protrusion portions 62. The protrusion portions 62 correspond to a support portion. The printed circuit board 40 is fixed to the protrusion portions 62 by screw fastening, bonding, or the like.

A position at which the printed circuit board 40 is supported by the protrusion portions 62 is not particularly limited. The printed circuit board 40 is provided in a position where the printed circuit board 40 can be stably supported. In the present embodiment, the protrusion portions 62 are provided at both ends of the resin portion 60 in the X-direction so as to sandwich the sensor package 30 (the sensor chip 31) in the X-direction. Further, the protrusion portions 62 are also provided at both ends of the resin portion 60 in the y-direction. The protrusion portions 62 are provided so as to surround the sensor package 30. The protrusion portions 62 provided at both ends in the y-direction are partially disposed on the bus bar 20.

Next, an effect of the current sensor device 10 according to the present embodiment will be described.

In the present embodiment, the sensor package 30 is adhered and fixed to one surface 20a of the bus bar 20 without interposing the printed circuit board 40. Therefore, even if a temperature change occurs in the usage environment and each of the components of the current sensor device 10 expands or contracts, the sensor chip 31 is directly fixed to the bus bar 20, so that a relative position of the sensor chip 31 and the bus bar 20 can be prevented from being deviated due to a difference in the linear expansion coefficient.

In addition, even if the vibration (for example, vehicle vibration) is transmitted in the usage environment, since the sensor chip 31 is directly fixed to the bus bar 20, the relative position between the sensor chip 31 and the bus bar 20 can be prevented from being deviated.

In addition, even if warpage occurs in the printed circuit board 40 due to the temperature change, since the sensor chip 31 is directly fixed to the bus bar 20, the relative position between the sensor chip 31 and the bus bar 20 can be prevented from being deviated.

Further, even if the resin portion 60 is creep-deformed, since the sensor chip 31 is directly fixed to the bus bar 20, the relative position between the sensor chip 31 and the bus bar 20 can be prevented from being deviated.

As described above, according to the current sensor device 10 of the present embodiment, the relative position of the sensor chip 31 (magneto-electric conversion element) and the bus bar 20 can be prevented from being deviated.

In addition, since the sensor chip 31 is directly fixed to the bus bar 20 without interposing the printed circuit board 40, the sensor chip 31 can be brought close to the bus bar 20 in the Z-direction. As a result, the detection signal of the magneto-electric conversion element can be increased. Further, since the detection signal becomes large, a problem peculiar to the careless current sensor that the small signal is vulnerable to disturbance can be improved.

As described above, in the present embodiment, the sensor package 30 is fixed to the bus bar 20 without interposing the printed circuit board 40. The printed circuit board 40 is disposed on the opposite side of the sensor package 30 to the bus bar 20. In the configuration described above, the printed circuit board 40 is supported by the terminal portion 37. Further, according to the present embodiment, the resin portion 60 has the protrusion portions 62, and the printed circuit board 40 is also supported by the protrusion portions 62. Therefore, the connection reliability between the terminal portion 37 and the printed circuit board 40 can be enhanced while the relative position between the sensor chip 31 and the bus bar 20 can be prevented from being deviated.

In the configuration supported by the protrusion portions 62, the printed circuit board 40 is secured to the protrusion portions 62. Therefore, when warpage occurs in the printed circuit board 40, or when the resin portion 60 or the like expands or contracts, a stress may concentrate on a connection portion between the terminal portion 37 and the printed circuit board 40. On the other hand, according to the present embodiment, the bonding wire 37b configuring the terminal portion 37 has elasticity with respect to the Z-direction and the direction orthogonal to the Z-direction. Therefore, even if the warpage of the printed circuit board 40 and the expansion or contraction of the resin portion 60, or the like occurs in a state where the printed circuit board 40 is fixed to the protrusion portions 62, the bonding wire 37b is elastically deformed, and the concentration of stress on the connection portion between the terminal portion 37 and the printed circuit board 40 can be prevented.

Further, in the present embodiment, the magnetic shield body 50 includes the first magnetic shield body 51 and the second magnetic shield body 52 which are disposed so as to sandwich the sensor chip 31 in the Z-direction. As a result, the disturbance magnetic field can be suitably shielded from the sensor chip 31. In particular, in the present embodiment, the first magnetic shield body 51 is held by the resin portion 60, and the second magnetic shield body 52 is fixed to the back surface 40b of the printed circuit board 40. Therefore, an increase in the body size in the Z-direction can be prevented while the disturbance magnetic field is shielded.

Further, according to the present embodiment, the second magnetic shield body 52 has the recess portion 52a for accommodating a portion disposed on the back surface 40b side of the terminal portion 37. Therefore, the disturbance magnetic field can be suitably shielded while the connection reliability between the terminal portion 37 and the printed circuit board 40 can be ensured.

The terminal portion 37 having elasticity is not limited to the above example. For example, in the first modification shown in FIG. 4, lead terminals 37c are provided as the terminal portion 37. The lead terminals 37c are inserted into the printed circuit board 40.

More specifically, the printed circuit board 40 has through holes 42, and lands (not shown) are formed on the wall surfaces of the through holes 42. The through holes 42 are also referred to as through holes. The lead terminals 37c are inserted through the through holes 42 from the opposing surface 40a side to the back surface 40b side, and are connected to the lands of the wall surfaces by a solder 71. The lead terminals 37c each have a meander-shaped spring portion 37d as a portion closer to the bus bar 20 than the connection portion with the printed circuit board 40. Even with the configuration described above, a stress can be prevented from being concentrated on the connection portion between the terminal portion 37 and the printed circuit board 40 while the relative position between the sensor chip 31 and the bus bar 20 can be prevented from being deviated.

In the first modification, the recess portion 52a of the second magnetic shield body 52 is provided so as to accommodate portions of the lead terminals 37c protruding toward the back surface 40b side. Further, a mold package structure is adopted as the sensor package 30, and the sensor chip 31, the processing circuit chip 33, and the like are sealed with a mold resin.

Second Embodiment

The present embodiment can refer to the preceding embodiment. For that reason, a description of a portion common to the current sensor device 10 described in the preceding embodiment will be omitted.

In the preceding embodiment, the terminal portion 37 has elasticity at least in the Z-direction, and the printed circuit board 40 is supported by the protrusion portions 62. In the present embodiment, on the other hand, as shown in FIG. 5, a printed circuit board 40 is supported by a terminal portion 37 with a gap 72 between the printed board 40 and a resin portion 60.

More specifically, a sensor package 30 has pads 37e as the terminal portion 37. The sensor package 30 according to the present embodiment has the same structure as that of the sensor package 30 according to the first embodiment shown in FIG. 2 except for the bonding wires 37b. Lands (not shown) are formed on an opposing surface 40a of the printed circuit board 40. The pads 37e are connected to the land of the opposing surface 40a by the solder 71. In other words, a connection structure between the sensor package 30 and the printed circuit board 40 is rigid.

Figure 5:
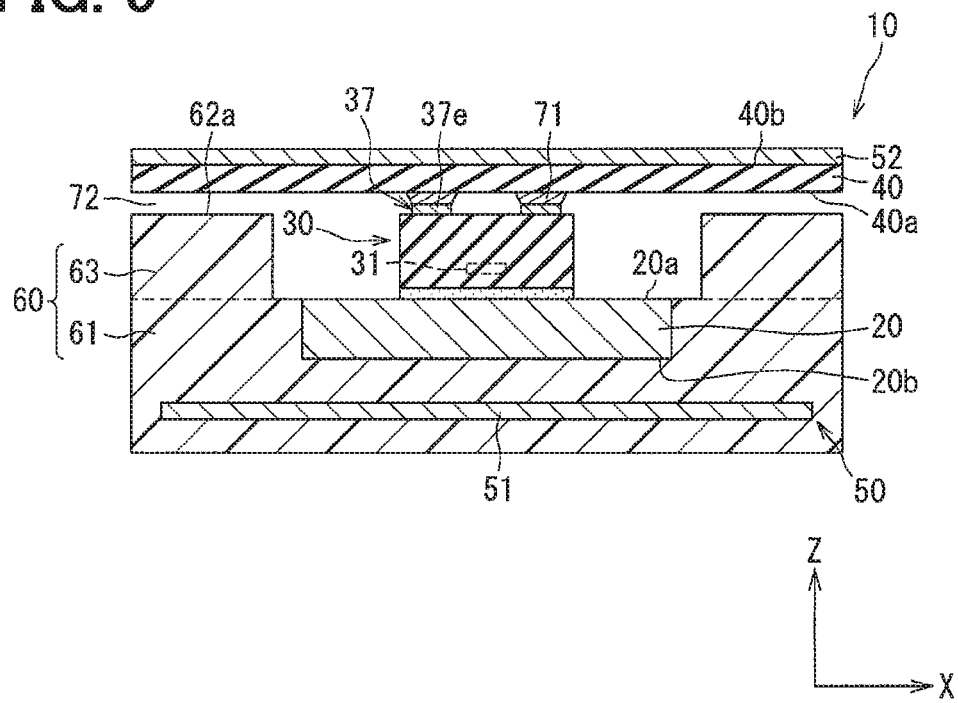
FIG. 5 is a cross-sectional view showing a schematic configuration of a current sensor device according to a second embodiment, and corresponds to FIG. 2.

As shown in FIG. 5, the resin portion 60 has protrusion portions 63 in addition to a base portion 61. Unlike the protrusion portions 62 having a support function, the protrusions 63 are provided so that tip end faces 63a come out of contact with the opposing surface 40a of the printed circuit board 40.

According to the above configuration, even if warpage of the printed circuit board 40 or expansion or contraction of the resin portion 60 or the like occurs, since the printed circuit board 40 is not fixed to the resin portion 60, the stress can be prevented from being concentrated on the connection portion between the terminal portion 37 and the printed circuit board 40.

In FIG. 5, although the resin portion 60 has the protrusion portions 63, only the base portion 61 may be provided without provision of the protrusions 63.

Figure 6:
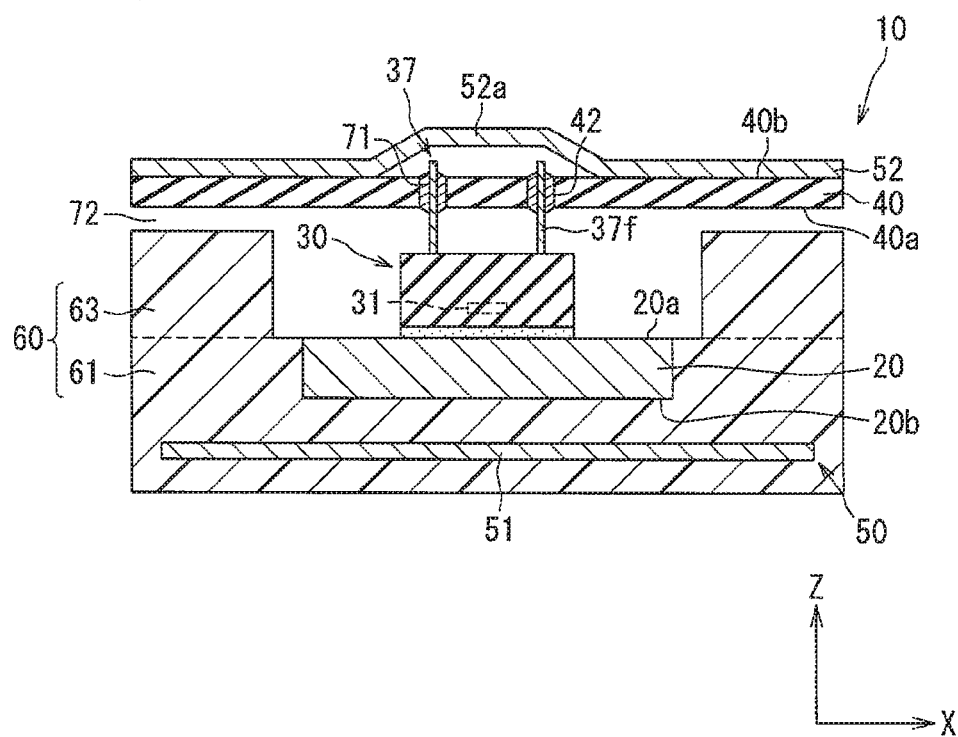
FIG. 6 is a cross-sectional view showing a second modification, which corresponds to FIG. 2.

A rigid connection structure between the sensor package 30 and the printed circuit board 40 is not limited to the above example. For example, in a second modification shown in FIG. 6, lead terminals 37f are provided as the terminal portion 37. The lead terminals 37f extend along the Z-direction and are inserted into the printed circuit board 40. The lead terminals 37f do not have the spring portions 37d like the lead terminals 37c described above. The protrusion portions 63 are provided so that the tip end faces 63a come out of contact with the opposing surface 40a of the printed circuit board 40. Therefore, even if warpage of the printed circuit board 40 or expansion or contraction of the resin portion 60 or the like occurs, the stress can be prevented from being concentrated on the connection portion between the terminal portion 37 and the printed circuit board 40.

Third Embodiment

The present embodiment can refer to the preceding embodiment. For that reason, a description of a portion common to the current sensor device 10 described in the preceding embodiment will be omitted.

Figure 7:
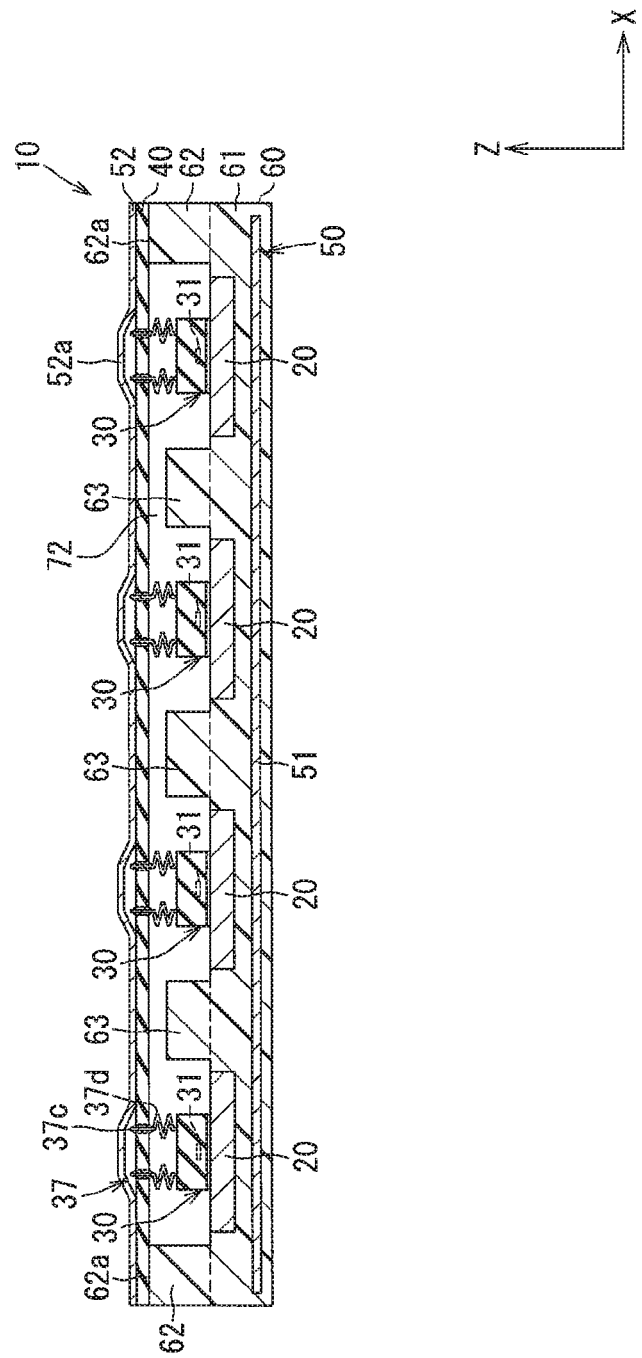
FIG. 7 is a cross-sectional view showing a current sensor device according to a third embodiment, which corresponds to FIG. 2.

In the preceding embodiment, an example has been shown in which the current sensor device 10 includes one bus bar 20 and one sensor package 30. In other words, an example in which one bus bar 20 is held in the resin portion 60 has been described. On the other hand, as shown in FIG. 7, a current sensor device 10 of the present embodiment includes multiple bus bars 20 and multiple sensor packages 30.

More specifically, the current sensor device 10 includes four bus bars 20 and four sensor packages 30 for respectively detecting currents flowing through the bus bars 20. The four bus bars 20 configure, in a power conversion device having a three-phase inverter and a boost converter, connection lines between upper and lower arms configuring the three-phase inverter and a motor in each phase, and a connection line between a positive electrode side of a battery and the boost converter.

Figure 4:
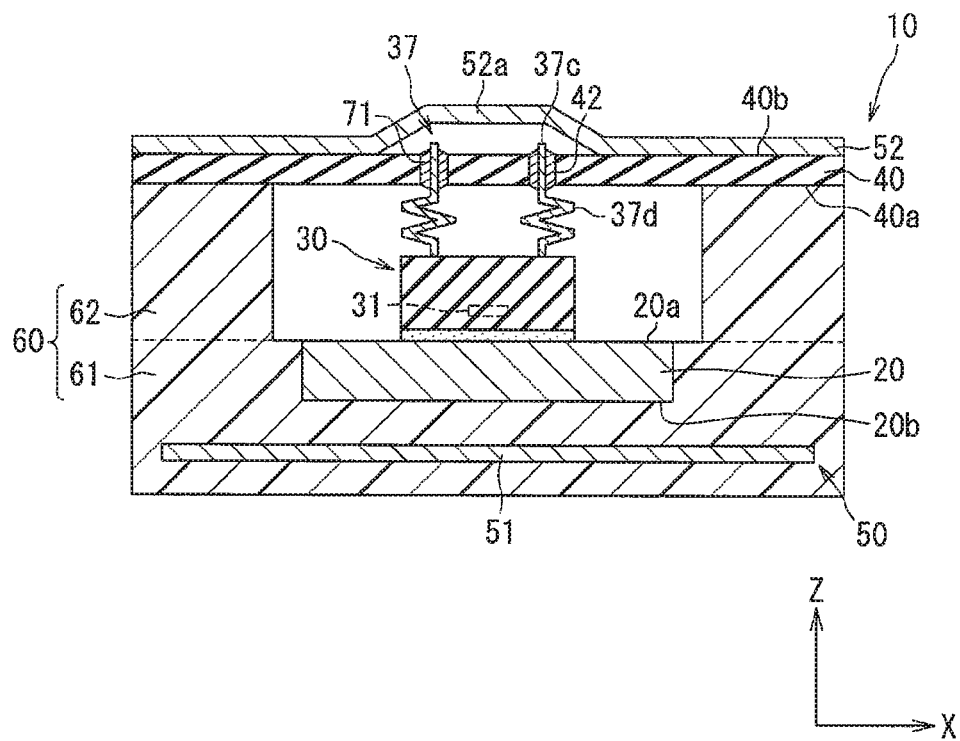
FIG. 4 is a cross-sectional view showing a first modification, corresponding to FIG. 2.

Each bus bar 20 is held by a resin portion 60 so that a plate thickness direction is in a Z-direction. The multiple bus bars 20 are provided side by side in an X-direction, which is a width direction. A sensor package 30 is individually fixed to one surface 20a of each bus bar 20. A printed circuit board 40 is disposed so as to extend across the multiple bus bars 20 provided side by side in the X-direction. A first magnetic shield body 51 and a second magnetic shield body 52 are also disposed so as to extend across the multiple bus bars 20 provided side by side in the X-direction. In FIG. 7, the configuration shown in the first modification shown in FIG. 4 is adopted as the sensor package 30.

The resin portion 60 has protrusion portions 62 in addition to a base portion 61. Tip end faces 62a of the protrusion portions 62 come in contact with an opposing surface 40a of the printed circuit board 40, and the printed circuit board 40 is supported by the protrusion portions 62. In the present embodiment, the resin portion 60 further includes protrusion portions 63. More specifically, the protrusion portions 62 are respectively provided at both ends of the resin portion 60 in the X-direction, and the multiple bus bars 20 are disposed between the pair of protrusion portions 62. In the resin portion 60, the protrusion portions 63 are provided in portions between the adjacent bus bars 20. In other words, the printed circuit board 40 is fixed to the resin portion 60 at both ends in the X-direction, and a gap 72 is provided between the printed circuit board 40 and the resin portion 60 inside the both ends.

Figure 8:
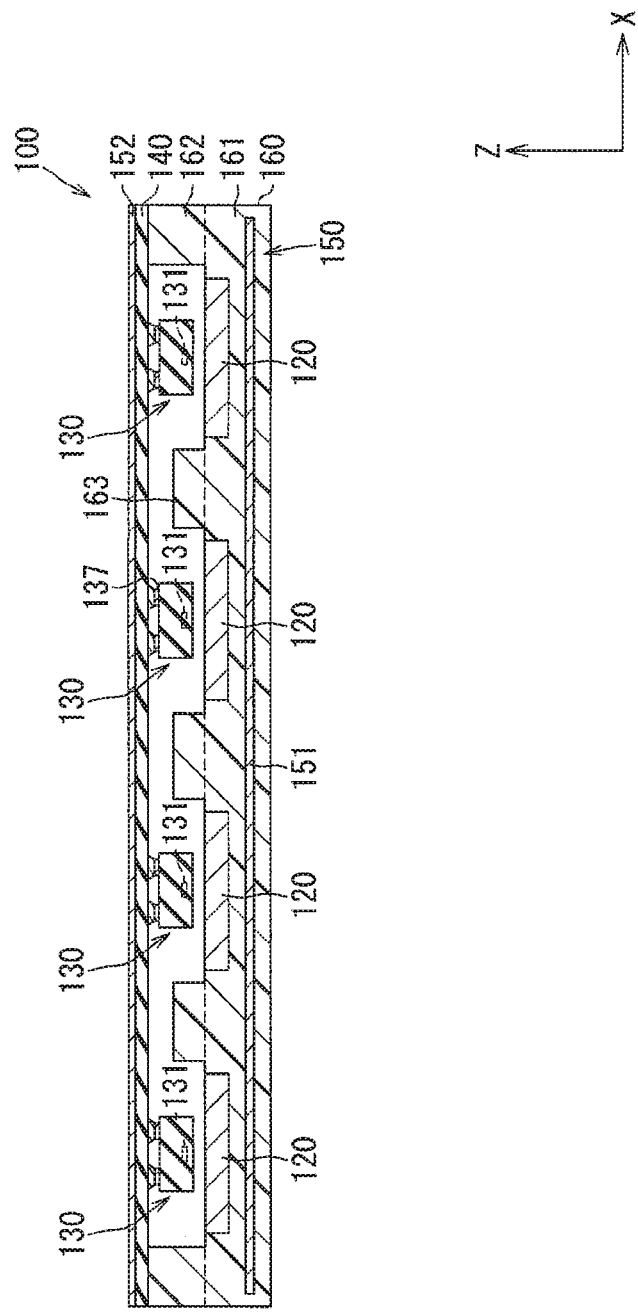
FIG. 8 is a cross-sectional view showing a reference example, and corresponds to FIG. 7.

Next, the effects of the current sensor device 10 described above will be described. FIG. 8 is a cross-sectional view showing a reference example, and corresponds to FIG. 7. In the reference example, reference numerals obtained by adding 100 are assigned to elements associated with the elements of the present embodiment.

In the reference example shown in FIG. 8, sensor packages 130 are mounted on a printed circuit board 140, and the printed circuit board 140 is fixed to a resin portion 160. More specifically, terminal portions 137 (pads) of sensor packages 130 are soldered to lands (not shown) of the printed circuit board 140. The resin portion 160 has the same configuration as the resin portion 60 shown in FIG. 7, and has a base portion 161 and protrusion portions 162 and 163. The protrusions 162 are respectively provided at both ends of the resin portion 160 in the X-direction, and multiple bus bars 120 are disposed between a pair of the protrusion portions 162. In the resin portion 160, protrusion portions 163 are provided in respective portions between the adjacent bus bars 120. The printed circuit board 140 is supported by the protrusion portions 162.

In the reference example, the sensor packages 130, that is, sensor chips 131 each having a magneto-electric conversion element formed are disposed in a floating state with respect to the bus bars 20. The sensor packages 30 are not fixed to the bus bars 120, and the printed circuit board 140 and the resin portion 160 are interposed between the sensor packages 130 and the bus bars 120. Therefore, a relative position of the sensor chip 131 (magneto-electric conversion element) and the bus bar 120 is more likely to be deviated due to a temperature change or vibration in the usage environment.

In particular, as a distance to the printed circuit board 140 and the resin portion 160 from a fixed end increases, a deviation based on a difference in the linear expansion coefficient increases. Therefore, in the configuration in which the multiple bus bars 120 are provided side by side as shown in FIG. 8, the deviation of the relative position between the sensor chips 131 and the bus bars 120 increases more as the position of the sensor package 30 is farther away from the fixed end in the X-direction.

It is also conceivable to provide the protrusion portions 162 instead of the protrusions 163. However, in such a configuration, the fixed ends of the printed circuit board 140 and the resin portion 160 are located to both sides of the connection portions of the terminal portions 137 and the printed circuit board 140. Therefore, when there is no stress escape field and warping of the printed circuit board 40 or expansion or contraction of the resin portion 60 or the like occurs, a stress is concentrated on the connection portions between the terminal portions 137 and the printed circuit board 140.

On the other hand, in the present embodiment, the sensor packages 30 are individually fixed to the respective bus bars 20. Therefore, regardless of the distance from the fixed end to the printed circuit board 140 and the resin portion 160, a deviation can be prevented from occurring in the relative position between the bus bar 20 and the sensor chip 31. Further, since the deviation can be prevented from occurring in the relative position, the number of protrusion portions 62 having the support function can be reduced. As a result, when warping of the printed circuit board 40 or expansion or contraction of the resin portion 60 or the like occurs, the stress can be prevented from being concentrated on the connection portion between the terminal portion 37 and the printed circuit board 40.

In particular, according to the present embodiment, the respective protrusion portions 62 are provided at both ends of the resin portion 60 in the X-direction, and the respective protrusions 63 are provided at portions between the adjacent bus bars 20. In other words, in the printed circuit board 40, at least one of the portions adjacent to the connection portion with the terminal portion 37 in the X-direction is in a floating state from the resin portion 60, and is not restrained by the resin portion 60. Therefore, the stress can be effectively prevented from being concentrated on the connection portion between the terminal portion 37 and the printed circuit board 40 while supporting the printed circuit board 40 by the protrusion portions 62.

In FIG. 7, lead terminals 37c each having a spring portion 37d is employed as each terminal portion 37. In this manner, with the employment of the terminal portions 37 which are elastically deformable, even if the number of the protrusion portions 62 is increased, the stress can be prevented from being concentrated on the connection portion between the terminal portion 37 and the printed circuit board 40. For example, in FIG. 7, all of the protrusions 63 may be replaced by the protrusion portions 62.

The number of bus bars 20 and the number of sensor packages 30 included in the current sensor device 10 are not limited to the example described above. The multiple bus bars 20 and the multiple sensor packages 30 may be provided. The configuration of the terminal portion 37 is not limited to the above example.

The disclosure herein is not limited to the illustrated embodiments. The disclosure encompasses the illustrated embodiments and variations based on the illustrated embodiments by those skilled in the art. For example, the disclosure is not limited to the combination of elements shown in the embodiments. The disclosure may be implemented in various combinations. The disclosed technical scope is not limited to the description of the embodiments. The several technical ranges disclosed are indicated by the description of the claims, and should be construed to include all changes within the meaning and range equivalent to the description of the claims.

Figure 9:
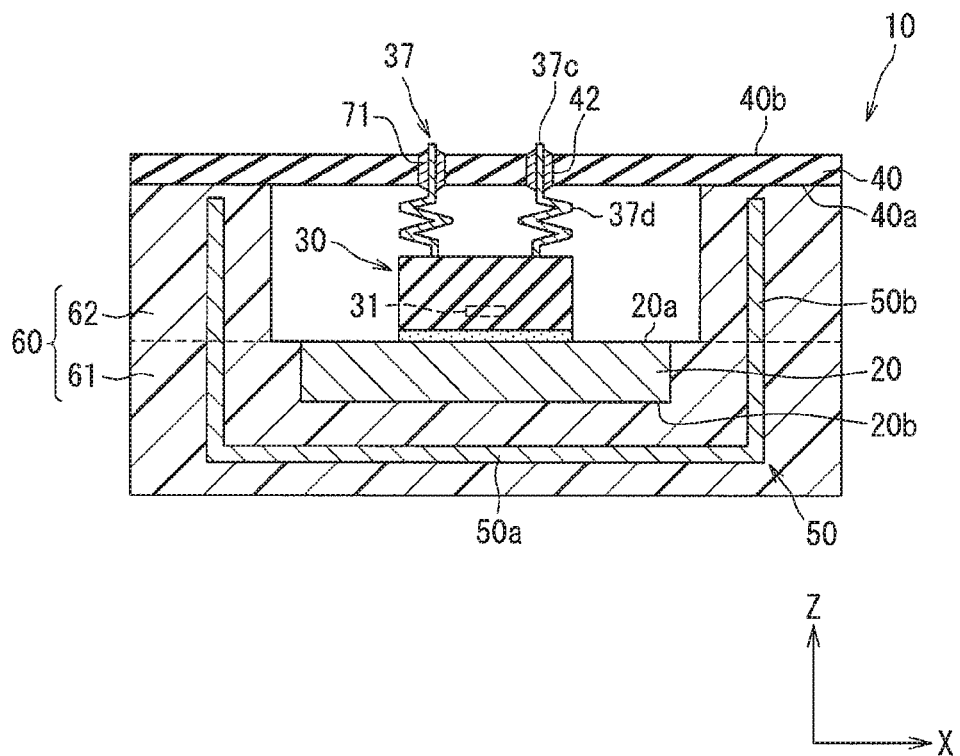
FIG. 9 is a cross-sectional view showing a third modification, which corresponds to FIG. 2.

Although the example in which the first magnetic shield body 51 and the second magnetic shield body 52 are provided as the magnetic shield body 50 has been described, the present disclosure is not limited to the above example. The magnetic shield body 50 may be disposed to shield the external magnetic field from the sensor chip 31 (the magneto-electric conversion element) and at least a part of the magnetic shield body 50 may be held by the resin portion 60. For example, as in a third modification shown in FIG. 9, a magnetic shield body 50 having a U-shaped (C-shaped) cross section can be employed, which includes a bottom portion 50a whose plate thickness direction is the Z-direction, and a side wall portion 50b which is bent with respect to the bottom portion 50a and whose thickness direction is the X-direction. In FIG. 9, the overall magnetic shield body 50 is embedded in the resin portion 60. Although an example in which at least a part of the magnetic shield body 50 is held by the resin portion 60 by insert molding has been described, the present disclosure is not limited to the above example. For example, the resin portion 60 may be held by bonding.

Figure 10:
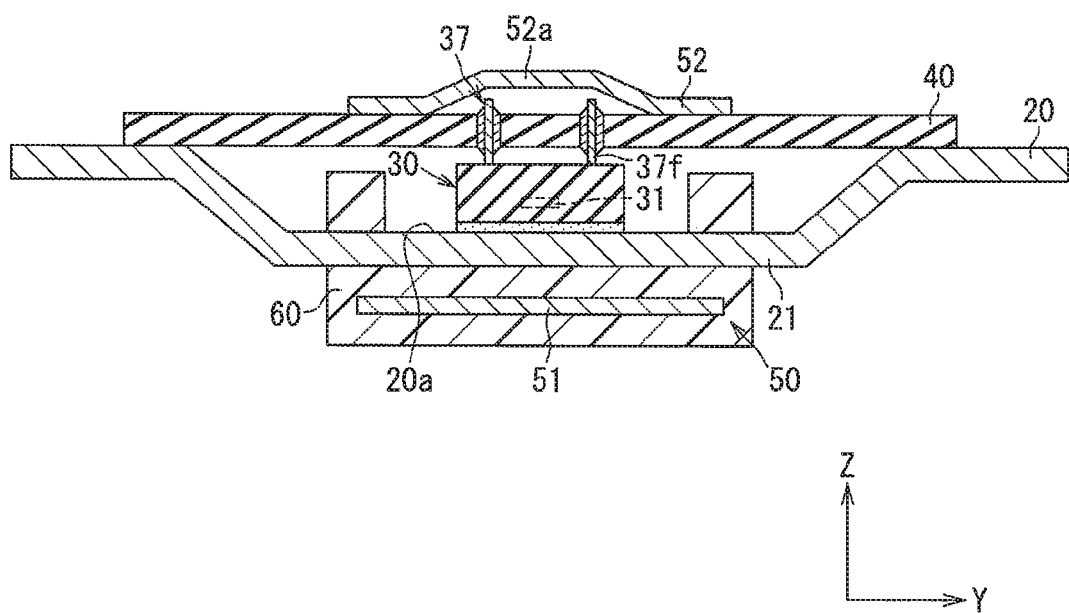
FIG. 10 is a cross-sectional view showing a fourth modification.

Although an example in which the printed circuit board 40 is supported by the resin portion 60 has been described, the present disclosure is not limited to the above example. For example, as in a fourth modification shown in FIG. 10, the printed circuit board 40 may be supported by the bus bar 20. In FIG. 10, the printed circuit board 40 is supported by the bus bar 20 in the y-direction, which is an extension direction of the bus bar 20. The bus bar 20 is electrically insulated from the wiring of the printed circuit board 40. The bus bar 20 has a recess portion 21. A sensor package 30 is fixed to a portion of the one surface 20a that forms an inner surface of the bottom portion of the recess portion 21. In other words, the sensor package 30 is disposed in the recess portion 21. The Y-direction end portion of the printed circuit board 40 is supported by a peripheral portion of the recess portion 21 in the bus bar 20. This also makes it possible to improve the connection reliability between the terminal portion 37 and the printed circuit board 40. In FIG. 10, an example of the lead terminals 37f is shown as the terminal portion 37, but the present disclosure is not limited to the above case. The terminal portion 37 having an elastic function may be used.

Although the present disclosure has been described in accordance with the examples, it is understood that the disclosure is not limited to such examples or structures. The present disclosure encompasses various modifications and variations within the scope of equivalents. In addition, various combinations and configurations, as well as other combinations and configurations that include only one element, more, or less, are within the scope and spirit of the present disclosure.

What is claimed is:

1. A current sensor device comprising:
    at least one bus bar that has a front surface and a back surface opposite to the front surface in a thickness direction of the bus bar;
    at least one sensor package that includes a magneto-electric conversion element, which detects a current flowing through the bus bar and an external connection terminal, which is electrically connected to the magneto-electric conversion element, the at least one sensor package being fixed to the front surface of the bus bar;
    a printed circuit board that is disposed on the sensor package opposite to the bus bar, and electrically connected to the terminal;
    a magnetic shield body that shields the magneto-electric conversion element from an external magnetic field; and
    a resin element that integrally holds at least a part of the magnetic shield body and the bus bar fixed to the sensor package, wherein
    the magnetic shield body includes a first magnetic shield body and a second magnetic shield body, which sandwich the magneto-electric conversion element in the thickness direction between the first and second magnetic shield bodies;
    the first magnetic shield body is held by the resin element;
    the second magnetic shield body is fixed directly to a second surface of the printed circuit board opposite to a first surface facing the bus bar;
    the terminal has a portion disposed on the second surface side of the printed circuit board; and
    the second magnetic shield body includes a flat upper surface having a recess that accommodates the portion of the terminal disposed on the second surface side, and the recess in the flat upper surface protrudes away from the printed circuit board.

2. The current sensor device according to claim 1, wherein:
    the resin element includes a base that holds the bus bar, and a support that protrudes from the base and supports the first surface of the printed circuit board facing the bus bar;
    the printed circuit board is fixed to the support; and
    the terminal has elasticity in at least the thickness direction.

3. The current sensor device according to claim 1, wherein:
    the printed circuit board is supported by the terminal in a state in which a gap is provided between the printed circuit board and the resin element.

4. The current sensor device according to claim 1, wherein:
    the at least one bus bar includes a plurality of bus bars;
    the at least one sensor package includes a plurality of sensor packages;
    the plurality of bus bars are integrally held by the resin element and arranged side by side in a width direction perpendicular to the thickness direction;
    the sensor packages are fixed to the bus bars, respectively; and
    the printed circuit board is disposed across the plurality of bus bars arranged side by side in the width direction.

5. The current sensor device according to claim 4, wherein:

the resin element includes a base that holds a plurality of bus bars, and a support that protrudes from the base and supports the first surface of the printed circuit board facing the bus bars; and the printed circuit board is fixed to the support.

6. The current sensor device according to claim 5, wherein:

the support is arranged on both sides in the width direction of the plurality of bus bars arranged side by side in the width direction to sandwich the plurality of bus bars; and a gap is provided between a part of the resin element disposed between the adjacent bus bars and the printed circuit board.

7. The current sensor device according to claim 1, wherein the first magnetic shield body is embedded in the resin element.

8. The current sensor device according to claim 1, wherein the recess of the second magnetic shield body directly protrudes from a portion of the printed circuit board that contacts the second magnetic shield body.

* * * * *